United States Patent [19]

Hayashi

[11] Patent Number: 4,651,334
[45] Date of Patent: Mar. 17, 1987

[54] VARIABLE-RATIO FREQUENCY DIVIDER

[75] Inventor: Yoshihiko Hayashi, Yokohama, Japan

[73] Assignee: Hitachi, Ltd., Tokyo, Japan

[21] Appl. No.: 686,012

[22] Filed: Dec. 24, 1984

[30] Foreign Application Priority Data

Dec. 26, 1983 [JP] Japan .................... 58-243854

[51] Int. Cl.$^4$ ........................................ H03K 21/06
[52] U.S. Cl. ...................................... 377/108; 377/47; 328/25; 307/271
[58] Field of Search ................ 377/108, 119, 118, 47, 377/48; 307/271, 219.1, 479, 606; 328/25, 30

[56] References Cited

U.S. PATENT DOCUMENTS

| | | | |
|---|---|---|---|
| 3,739,156 | 6/1973 | Gebelein, Jr. et al. | 377/47 |
| 3,832,640 | 8/1974 | Cederquist et al. | 377/47 |
| 4,041,403 | 8/1977 | Chiapparoli, Jr. | 377/48 |
| 4,053,739 | 10/1977 | Miller et al. | 377/47 |
| 4,366,394 | 12/1982 | Clendening et al. | 377/47 |

FOREIGN PATENT DOCUMENTS

| | | | |
|---|---|---|---|
| 83132 | 7/1981 | Japan | 377/47 |
| 111323 | 9/1981 | Japan | 377/47 |
| 153842 | 11/1981 | Japan | 377/118 |

Primary Examiner—Stanley D. Miller
Assistant Examiner—Karl Ohralik
Attorney, Agent, or Firm—Antonelli, Terry & Wands

[57] ABSTRACT

A variable-ratio frequency divider has a D flip-flop which makes possible high-speed operation, and the number of frequency divisions is made variable by changing the transmission delay time of a delay element included in a feedback loop from the output $\overline{Q}$ to a predetermined terminal of the D flip-flop.

3 Claims, 8 Drawing Figures

VARIABLE-RATIO FREQUENCY DIVIDER

BACKGROUND OF THE INVENTION

1. Field of the Invention

This invention relates to a variable-ratio frequency divider having a wide range of frequency-dividing ratio and suitable for high-speed operation, or more in particular to a variable-ratio frequency divider adaptable for use with a timing generator of a test apparatus for conducting a high-precision timing test of an IC or LSI and the like.

2. Description of the Prior Art

One of the important component elements of an IC test apparatus is a timing generator. The timing generator has dual functions; one is to determine the timing (test period) of the test pattern applied to the IC to be tested, and the other is to specify the timing (the phase against the test period) at which an output signal of the IC impressed with the test pattern is compared with an expectation-value pattern. The timing signal generator for IC test roughly comprises a rate generator for determining a test period and a plurality of phase generators for generating a signal in a given phase against the test period. First, the prior art will be explained with reference to the drawings.

FIG. 1 is a block diagram showing an example of a conventional timing signal generator. For simplification, a single rate generator RG and a single phase generator PG are provided. In order to change the timing in real time, a test period signal 102 and a phase signal 103 are produced in response to a timing selection signal 101. The operation of this device will be explained briefly below.

In FIG. 1, upon application of the timing selection signal 101 to the circuit, it is introduced to a latch 7 in synchronism with a test period signal 102 that has thus far been produced. The latch 7 makes access to a rate memory 6 containing test period data and a phase memory 9 having phase signal data stored therein to read the test period data and the phase signal data, respectively.

In the rate generator RG, the test period signal 102 is generated by a rate counter for determining the test period which is an integral multiple of the basic clock period produced from an oscillator 1 and a variable delay circuit 3 for delaying the output of the rate counter 2 for improving the resolution of the test period more than the period of the basic clock.

The frequency-dividing ratio of the rate counter 2 and the delay time of the variable delay circuit 3 are controlled according to the data stored in the latch 4. In order to improve the resolution by the variable delay circuit 3, the data in the latch 4 is determined by an adder 5 for adding the delay time set in the preceding test period (the data stored in the latch 4) to a set value less than the period of the basic clock.

Further, in order to supply the basic clock in phase with the test period signal 102 to the phase generator PG for generating the phase signal 103, a phase clock 100 is generated by a variable delay circuit 8 for delaying the output of the oscillator 1.

The phase generator PG, on the other hand, produces a coincidence output at a time point when the phase data read out of the phase memory 9 and set in the latch 10 coincides with the count made by the phase counter 11, and further applies this coincidence output to a variable delay circuit 12 for producing the phase signal 103 in order to improve the phase resolution.

In the case where a preset counter is used as the rate counter for the variable-ratio frequency dividing operation, it is difficult to attain a high resolution of the clock after the frequency dividing process since the frequency of the basic clock is limited by the operating speed of the counter. For this reason, the basic clock is converted into a high frequency by inserting a prescaler before and after the preset counter thereby to attain a high resolution of the clock after frequency division. Since the minimum frequency divided is limited by the variable frequency dividing ratio of the prescalers, however, the range of the variable frequency ratio is small.

FIG. 2 is a circuit diagram showing an example of a conventional 2-modulus prescaler, and FIG. 3 is a block diagram showing an example of a variable-ratio frequency divider using the 2-modulus prescaler.

The prior art will be specifically explained with reference to FIGS. 2 and 3.

A prescaler 27 includes an OR gate 21, an AND gate 22, a NOR gate 23 and D flip-flops 24, 25, 26 for dividing the frequency of a basic clock $f_{in}$ and producing a frequency $f_{out}$.

The number of frequency divisions is controlled by a selection signal SEL. For example, it is 5 when the selection signal SEL is "high", and 6 when the selection signal SEL is "low".

Counters 28, 29 are inserted as shown in FIG. 3 since it is impossible to make continuously variable frequency divisions only with the prescaler. In the case where the data value "A" and data value "B" are present in the counters 28 and 29 respectively, the number of frequency divisions is given by the equation (1) below.

$$N = f_{in}/f_{out} = 6A + 5(B-A) = A + 5B \qquad (1)$$

This number of frequency divisions N can be changed in units of one by changing the value of data A, and in units of five by changing the value of data B. The minimum number of frequency divisions N which is continuously variable is 20 taking the condition $B \geq A$ into consideration.

Generally, when the number of frequency divisions of the prescalers is U and L respectively, the relation $U = L + 1$ is held, and therefore the minimum number of frequency divisions $N_{min}$ which is continuously variable is expressed by the equation (2) below.

$$N_{min} = L(L-1) \qquad (2)$$

Specifically, if the number of frequency divisions U, L of the prescalers is increased in order to reduce the operating speed of the counter, the minimum number of frequency divisions $N_{min}$ is increased thereby to narrow the variable range of the number of frequency divisions N.

If an IC test is to be conducted at high operating speed on the one hand and various ICs are to be tested on the other hand, therefore, a variable-ratio frequency divider having a wide variable range of the number of frequency divisions is desired.

SUMMARY OF THE INVENTION

The object of the present invention is to obviate the above-mentioned disadvantages of the prior art and to provide a variable-ratio frequency divider which can be operated at high speed and which has a wide variable range of the number of frequency divisions.

According to the present invention, there is provided a variable-ratio frequency divider comprising a D flip-flop for realizing a high-speed operation and a delay element in a feedback loop from an output $\bar{Q}$ of the D flip-flop to a predetermined terminal, wherein the number of frequency divisions is rendered variable by changing the transmission delay time of the delay element.

DESCRIPTION OF THE PREFERRED EMBODIMENTS

An embodiment of the present invention will be explained below with reference to the accompanying drawings.

Figure 1:
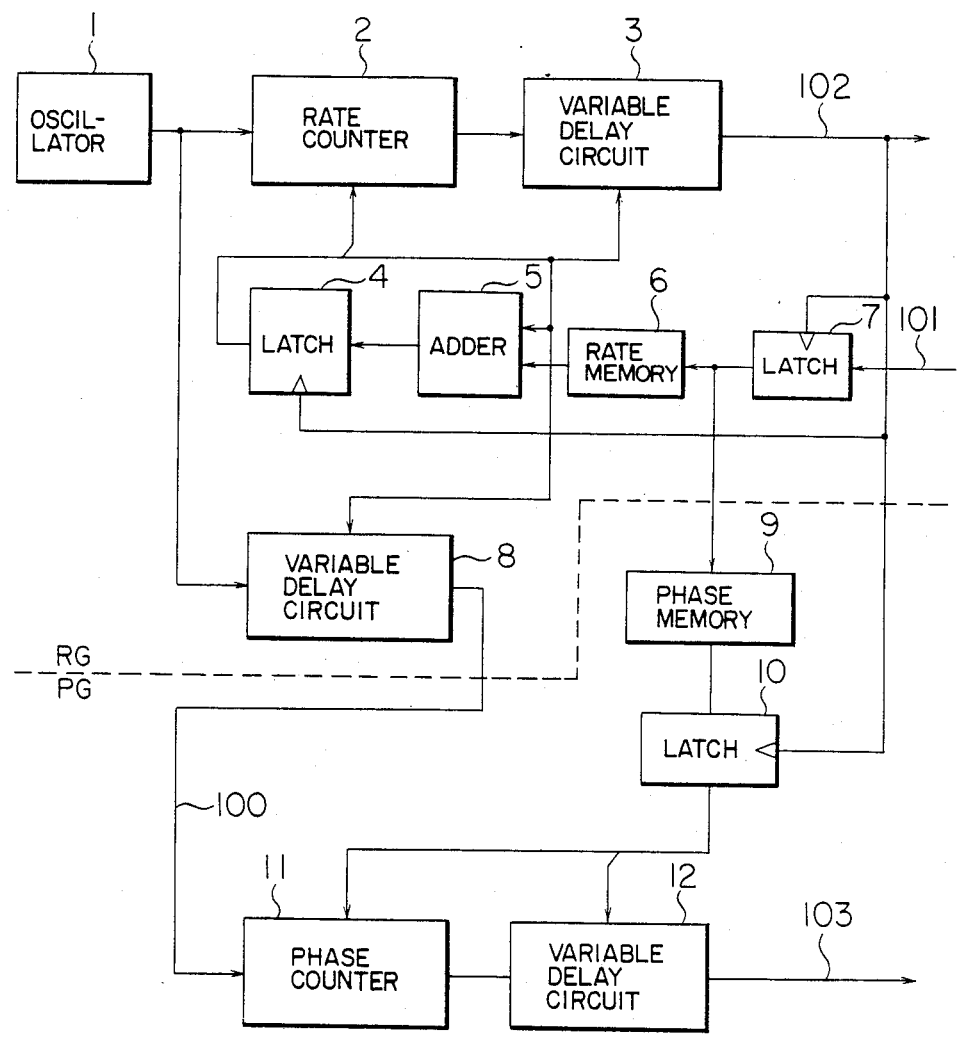
FIG. 1 is a diagram showing a circuit of a conventional timing signal generator used with an IC test apparatus.
Figure 2:
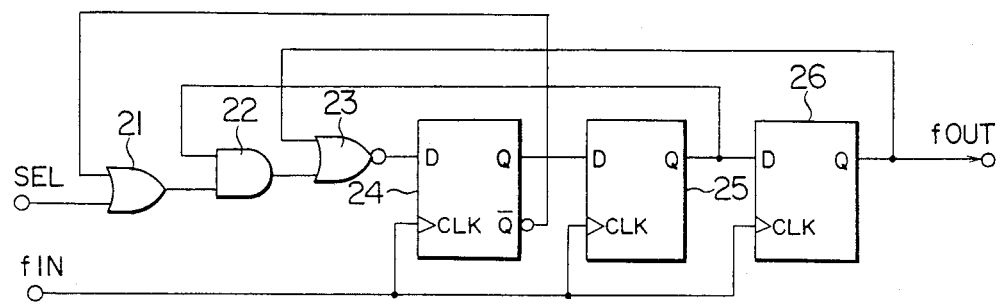
FIG. 2 is a diagram showing a circuit of an example of a conventional 2-modulus prescaler.
Figure 3:
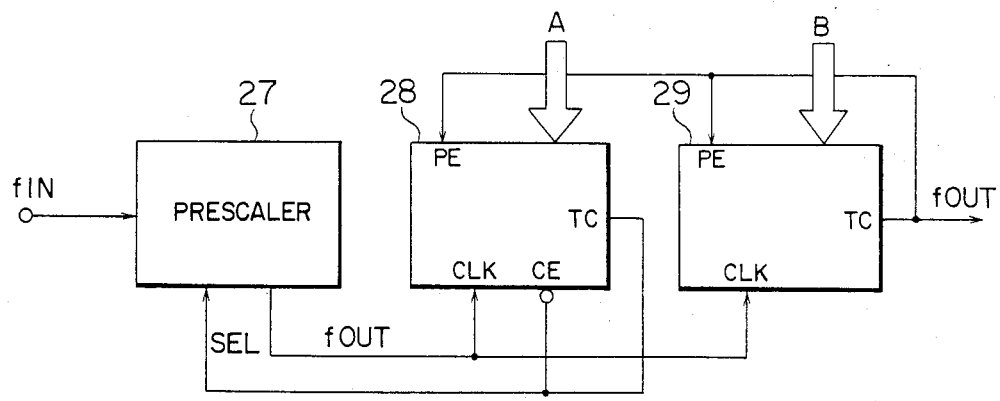
FIG. 3 is a block diagram showing an example of a variable-ratio frequency divider using the 2-modulus prescaler.
Figure 4:
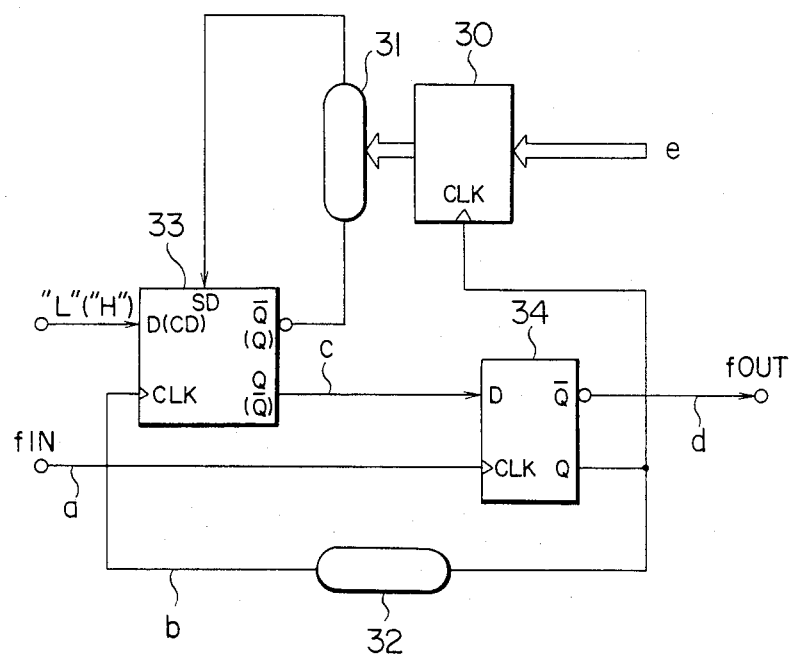
FIG. 4 is a block diagram showing a first embodiment of a variable-ratio frequency divider according to the present invention.
Figure 5:
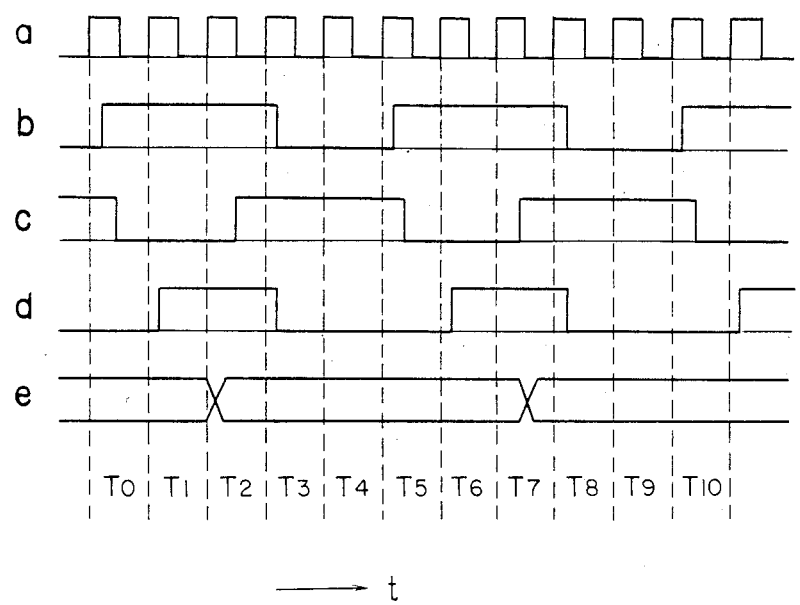
FIG. 5 is an operation timing chart of the first embodiment.

FIG. 4 is a block diagram showing a variable-ratio frequency divider according to an embodiment of the present invention, and FIG. 5 is a timing chart of the operation of the same embodiment.

Reference numeral 30 designates a latch for delay means, numeral 31 a variable delay element, numeral 32 a fixed delay element, and numerals 33 and 34 first and second D flip-flops (hereinafter referred to merely as the D flip-flops).

The waveforms a to e in FIG. 5 correspond to the points designated by the same characters in FIG. 4.

First, the delay time of the delay element 31 can be controlled by the value e held in the latch 30, and it is assumed that the desired value of the value e is not selected fixedly.

Also, assume that the basic clock $f_{in}$ (waveform a) is supplied to the D flip-flop 34. When the positive edge (the beginning of the section T0) of the clock (waveform b) is applied to the clock terminal CLK of the D flip-flop 33, the output Q (waveform c) thereof becomes "low".

On the other hand, the output $\bar{Q}$ of the D flip-flop 33 becomes "high", and after the lapse of the time set by the delay element 31, sets the D flip-flop 33. As a result, the output Q becomes "high" at the section T2.

The output Q of flip-flop 33 (waveform C) is applied to the input terminal D of the D flip-flop 34, so that a frequency-divided clock $f_{out}$ (waveform d) of which the timing has been taken again by the basic clock $f_{in}$, is produced from the output $\bar{Q}$. The output Q of the D flip-flop 34 is applied through the delay element 32 to the clock terminal CLK of the D flip-flop 33, thus producing the frequency-divided $f_{out}$ synchronous with the basic clock $f_{in}$.

Let the period of the basic clock be T, and the transmission delay time of each element determined as below, then the number of frequency divisions N is expressed by equation (3) below.

$$(N-1)T < T_{CQ33} + T_{31} + T_{SQ33} + T_{SET34} + T_{CQ34} + T_{32} < N \cdot T \quad (3)$$

where $T_{CQ33}$ is the transmission delay time from the clock terminal CLK to the output $\bar{Q}$ of the D flip-flop 33, $T_{31}$ the transmission delay time of the delay element 31, $T_{SQ33}$ the transmission delay time from the set terminal SD to the output Q of the D flip-flip 33, $T_{SET34}$ the set up time of the clock from the input D of the D flip-flop 34, $T_{CQ34}$ the transmission delay time from the clock terminal CLK to the output Q of the D flip-flop 34, and $T_{32}$ the transmission delay time of the delay element 32.

It is thus possible to render the number of frequency divisions N continuously variable by properly setting the delay time of the delay element 31.

In FIG. 4, the data e corresponding to the dividing ratio 1/N is held by the latch 30 thereby to keep constant the transmission delay time of the delay element 31 for the period equal to a period of the frequency divided clock $f_{out}$. Specifically, the data e on the dividing ratio 1/N is held by the latch 30 by the negative edge of the waveform d during the section T3 in FIG. 5, thus controlling the width of the negative pulse in the sections T5 to T7 of the waveform d. It is thus possible to continuously control the number of frequency divisions N for each period of the frequency-divided clock $f_{out}$.

The same effect as the apparatus mentioned above is obtained from a modification of the above-mentioned embodiment in which, as shown in FIG. 4, a reset terminal CD is used instead of the set terminals SD of the D flip-flop 33, and the connection of the outputs Q and $\bar{Q}$ is reversed. In short, they are identical to each other with the only difference of positive and negative logics.

As obvious from the embodiments explained above, a counter is not used in the prescaler. Instead, the D flip-flop is used to realize a high-speed operation. At the same time, the number of frequency divisions can be easily changed as desired by changing the transmission delay time of the delay elements in the feedback loop from the output $\bar{Q}$ to the set terminal SD of the D flip-flop 33.

A second embodiment of the present invention will be explained with reference to FIGS. 6 to 8. The embodiment under consideration contains an improvement of the disadvantage of the first embodiment shown in FIG. 4 that the delay element 31 is unable to produce a long delay time and has a wider frequency dividing range.

Figure 6:
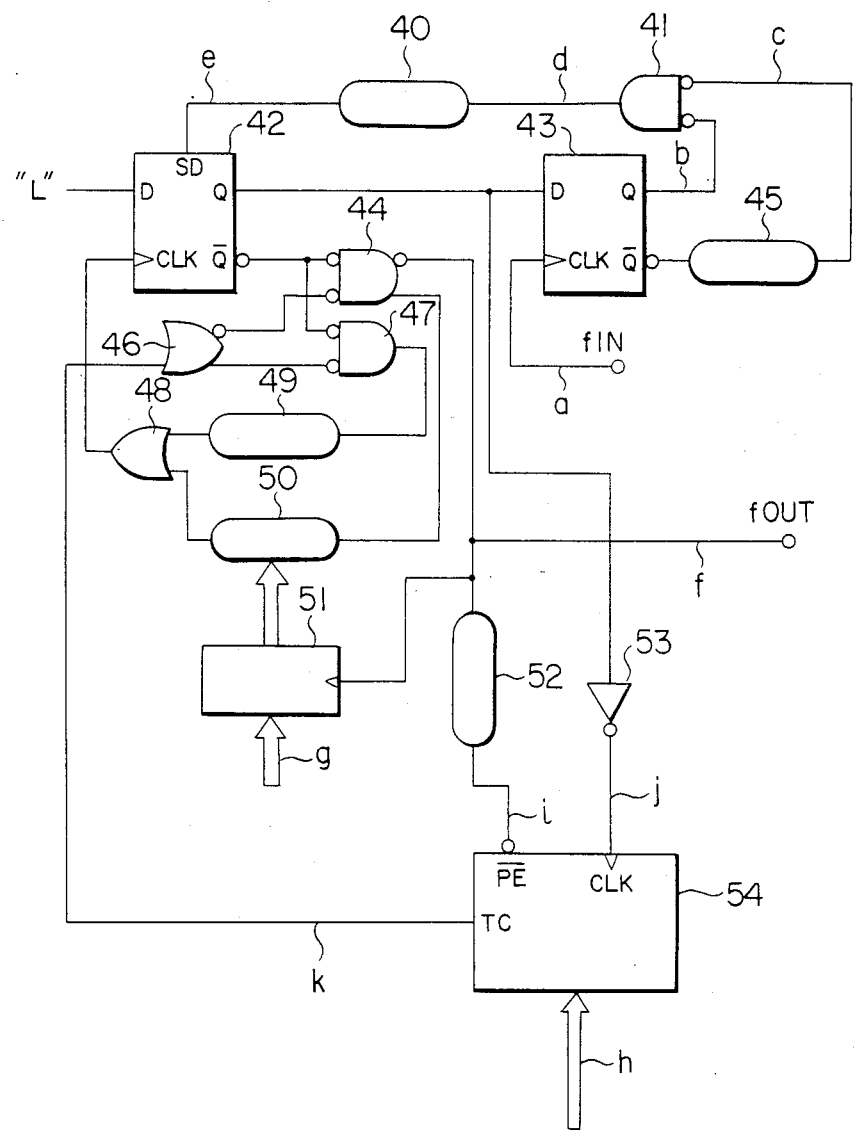
FIG. 6 is a block diagram showing a variable-ratio frequency divider according to a second embodiment of the present invention.
Figure 7:
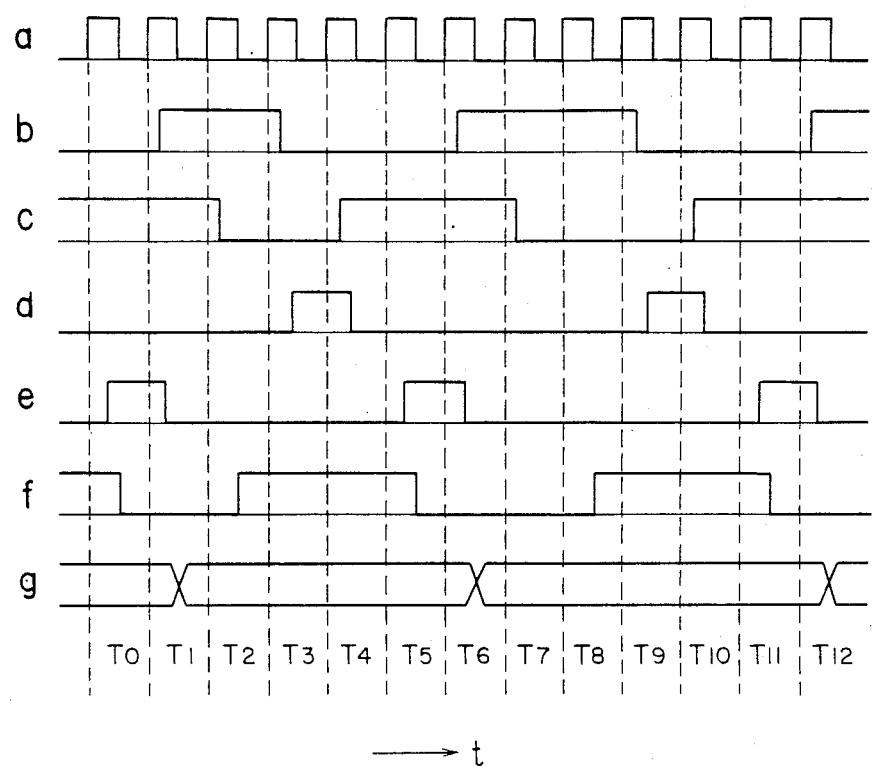
FIGS. 7 and 8 are operation timing charts of the second embodiment.
Figure 8:
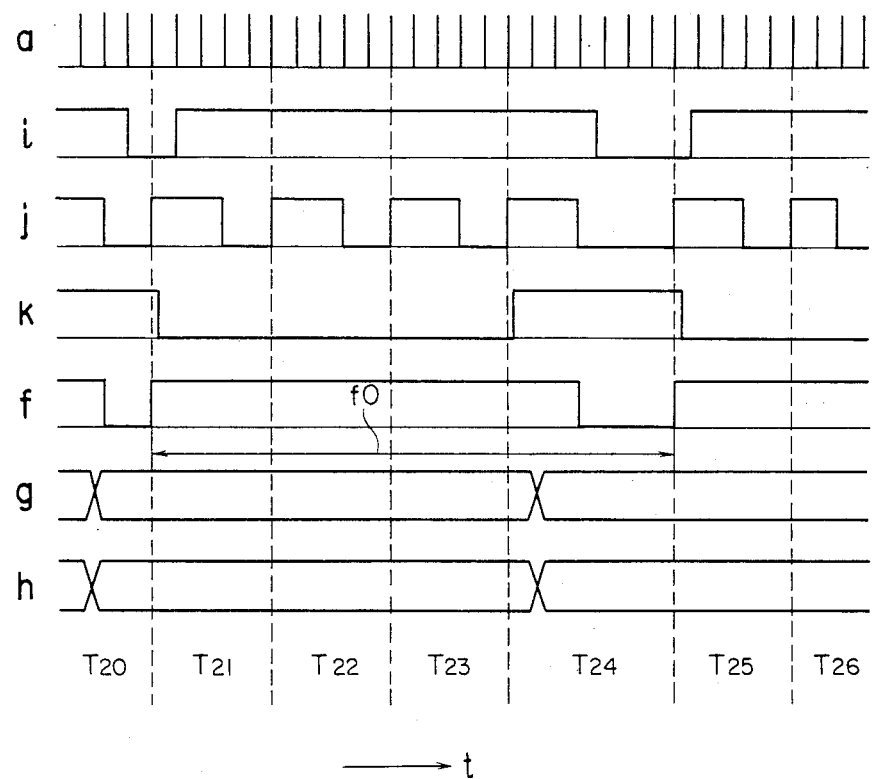

FIG. 6 is a block diagram showing a variable-ratio frequency divider circuit according to an embodiment of the present invention, and FIGS. 7 and 8 are timing charts of the operation thereof.

Numeral 51 designates a register for delay means, numeral 50 a variable delay element, numerals 40, 45, 49, 52 a fixed delay element, 42, 43 a D flip-flop, and numeral 54 a preset counter.

The waveforms a to g in FIG. 7 correspond to the points carrying the same characters in FIG. 6.

First, assume that the preset counter 54 is always supplied with an input 0 at the input terminal h thereof, and produces a "high" signal.

The delay time of the delay element 50 can be controlled by the value g held in the register 51, and assume that the desired value of g is selected and established.

Also, assume that the basic clock $f_{in}$ (waveform a) is supplied to the D flip-flop 42. When the set terminal SD of the D flip-flop 42 is supplied with a "high" (sections $T_0$ to $T_1$) pulse (waveform e), the output $\overline{Q}$ of the D flip-flop 42 becomes "low", and the waveform f becomes "low". At the same time, the output $\overline{Q}$ is applied through an AND gate 44, and after the lapse of the time set by the delay element 50, is applied through an OR gate 48 to the clock terminal of the D flip-flop 42, so that the set value "L" of the input terminal D is produced at the Q output thereof. This Q output is applied to the input terminal D of the flip-flop 43, thereby producing the Q output waveform b of which the timing has been taken again by the basic clock $f_{in}$ and the waveform c of the $\overline{Q}$ output delayed by the delay element 45, so that a "high" signal (sections $T_5$ to $T_6$) is applied to the set terminal of the D flip-flop 42 through the delay element 40.

As a result, a frequency-divided clock (waveform f) is obtained in synchronism with the basic clock $f_{in}$.

Let the period of the basic clock be T and the transmission delay time of each element be determined as below. Then, the number of frequency divisions N is expressed by equation (4) below.

$$N \cdot T < T_{CQ43} + T_{41} + T_{40} + T_{SQ42} + T_{44} + T_{50} + T_{48} + T_{CQ42} + T_{SET43} < (N+1) \cdot T \qquad (4)$$

where $T_{CQ43}$ designates the transmission delay time from the clock terminal CLK to the output Q of the D flip-flop 43, $T_{41}$ the transmission delay time of the AND gate 41, $T_{40}$ the transmission delay time of the delay element 40, $T_{SQ42}$ the transmission delay time from the set terminal SD to the output Q of the D flip-flop 42, $T_{44}$ the transmission delay time of the AND gate 44, $T_{50}$ the transmission delay time of the delay time 50, $T_{48}$ the transmission delay time of the OR gate 48, $T_{CQ42}$ the transmission delay time from the clock terminal CLK to the output Q of the D flip-flop 42, and $T_{SET43}$ the set-up time of the clock terminal CLK of the D flip-flop 43.

It is thus possible to render the number of frequency divisions N continuously variable by properly setting the delay time of the delay element 50.

In FIG. 6, the data g corresponding to the dividing ratio 1/N is held by the register 51, so that the transmission delay time is maintained constant for one period of the frequency-divided clock $f_o$. Specifically, the data g on the frequency dividing ratio 1/N is held at the register 51 by the positive edge of the waveform f during the section T2 in FIG. 7, thereby controlling the width of the negative pulse of the waveform f during the sections $T_5$ to $T_8$. The number of frequency divisions N is thus controlled so as to be continuously variable.

The operation of the preset counter 54 (h≠0) will be explained below with reference to FIGS. 6 and 8. The number of frequency divisions determined by the value g which is an input to the register 51 is assumed to be 5 to 9 by way of explanation, and description will be made below with reference to the case in which h is 3 and g is 7.

In FIG. 8, the negative pulse of the frequency-divided clock $f_o$ (waveform f) is produced during the section $T_{20}$, and the value 7 is stored in the register 51 at the positive edge of this pulse. A clock (waveform i) which is delayed from the frequency-divided clock is applied to the terminal $\overline{PE}$ of the preset counter 54, and the value 3 is stored in the counter 54 at the positive edge during the section $T_{20}$ of the output Q (waveform i) of the D flip-flop 42. As a result, the terminal count TC of the preset counter 54 becomes "low", and the OR gate 47 is selected through the OR gate 46. In the process, the clock (waveform j) providing applied to the preset counter 54 is obtained by dividing the basic clock $f_{in}$ (waveform a) by $N_C$. Let the period of the basic clock $f_{in}$ be T, and the number of frequency divisions $N_C$ is given by the equation (5) below.

$$N_C \cdot T < T_{CQ43} + T_{41} + T_{40} + T_{SQ42} + T_{47} + T_{49} + T_{48} + T_{CQ42} + T_{SET43} < (N_C+1) \cdot T \qquad (5)$$

ps where $T_{47}$ is the transmission delay time of the AND gate 47, and $T_{40}$ the transmission delay time of the delay element 49. In this case, the number of frequency divisions $N_C$ is assumed to be 5.

The preset counter 54 counts the clock (waveform i) and raises the terminal count TC to "high" level at the time point (section $T_{24}$) that the set value 3 has been counted. The AND gate 47 is thereby closed through the OR gate 46, and the AND gate 44 is selected. During the section $T_{24}$, therefore, the basic clock $f_{in}$ (waveform a) is frequency-divided by 7 as mentioned above by the value "7" stored in the register 51 and is supplied to the preset counter 54 while at the same time producing the frequency-divided clock $f_0$ (waveform f) from the AND gate 44. Specifically, the period of the frequency-divided clock is provided by the range from the positive edge of the waveform f of the section $T_{20}$ to the positive edge of the section $T_{24}$.

The number of frequency divisions $N_0$ for determining the frequency-divided clock $f_0$ by dividing the frequency of the basic clock $f_{in}$ is given by equation (6) below.

$$N_0 = f_{out}/f_{in} = g + 5h \qquad (6)$$

In order to generally determine the number of frequency divisions $N_0$, assume that the range of the set value g applied to the register 51 is from m to 2m−1, the number of frequency division with the AND gate 47 selected is m, and the value set in the preset counter 54 is h. Then the number of frequency divisions $N_0$ is expressed by equation (7) below.

$$N_0 = f_{out}/f_{in} = g + m \cdot h \qquad (7)$$

As obvious from above, the minimum number of frequency divisions is m, and since a D flip-flop instead of a counter is used in the prescaler, high-speed operation becomes possible. Further, the number of frequency divisions can be easily changed by changing the set value of the preset counter and the transmission delay time of the delay element in the feedback loop from the terminal $\overline{Q}$ to the clock terminal CLK of the D flip-flop.

It will be understood from the foregoing detailed explanation that according to the present invention, there is provided a variable-ratio frequency divider circuit having a high speed and a wide range of the number of frequency divisions, which has a great advantage satisfying the demand of various electronic circuits.

I claim:

1. A variable-ratio frequency divider comprising delay means providing a signal delay time which can be set according to a desired frequency-dividing ratio; a first D flip-flop having a feedback loop including said delay means connected from one output terminal to a set input terminal thereof and with the data input terminal thereof maintained at a logic low level; a second D flip-flop having a data input terminal connected to the other output terminal of said first D flip-flop and having the clock terminal thereof connected to receive a basic clock signal to be frequency-divided; and a delay element connected between the clock input of said first D flip-flop and one output terminal of said second D flip-flop, the other output terminal of said second D flip-flop providing a frequency-divided clock signal output.

2. A variable-ratio frequency divider comprising delay means providing a signal delay time which can be set according to a desired frequency-dividing ratio; a first D flip-flop having a feedback loop including said delay means connected from one output terminal thereof to the set terminal thereof and with the reset terminal thereof maintained at a logic high level; a second D flip-flop having a data input terminal connected to the other output terminal of said first D flip-flop and having the clock terminal thereof connected to receive a basic clock signal to be frequency-divided; and a delay element providing an output delayed by a predetermined value and connected between the clock input to said first D flip-flop and one output terminal of said second D flip-flop, the other output terminal of said second D flip-flop providing a frequency-divided clock signal output.

3. A variable-ratio frequency divider circuit comprising delay means providing a signal delay time which can be set according to a desired frequency-dividing ratio; a first D flip-flop having at least a pair of feedback loops connected from the inverted output terminal thereof to the clock terminal thereof and with the data input terminal thereof maintained at a logic low level, one of said feedback loops including said delay means; a second D flip-flop having the other output terminal of said first D flip-flop connected to the data input terminal thereof and with the clock terminal thereof connected to receive a basic clock signal to be frequency-divided; a delay element connected between one output of said second D flip-flop and a set input to said first D flip-flop; and control means including a counter and connected between said inverted output terminal of said first D flip-flop and said pair of feedback loops for switching said feedback loops, whereby said one of said feedback loops produces a frequency-divided clock signal.

* * * * *